United States Patent [19]

Chason et al.

[11] Patent Number: 4,642,511
[45] Date of Patent: Feb. 10, 1987

[54] EDGE-MOUNTING CONFIGURATION FOR AT-STRIP RESONATORS

[75] Inventors: Marc K. Chason, Schaumburg; Joseph P. Tomase, Libertyville; Michael J. Onystok, Bloomingdale, all of Ill.

[73] Assignee: Motorola, Inc., Schaumburg, Ill.

[21] Appl. No.: 646,175

[22] Filed: Mar. 31, 1986

[51] Int. Cl.[4] .......................................... H01L 41/08
[52] U.S. Cl. ................... 310/348; 310/368; 29/25.35
[58] Field of Search ............ 310/348, 351–356, 310/361, 370, 368, 367; 29/25.35

[56] References Cited

U.S. PATENT DOCUMENTS

| | | | |
|---|---|---|---|
| 2,626,363 | 1/1953 | Holmbeck | 310/353 |
| 3,209,178 | 9/1965 | Koneval | 310/344 X |
| 3,340,410 | 9/1967 | Sanford | 310/353 |
| 4,034,318 | 7/1977 | Ishiyana et al. | 310/348 |
| 4,079,284 | 3/1978 | Fanshawe | 310/348 |
| 4,124,809 | 11/1978 | Engdahl et al. | 310/353 |
| 4,216,402 | 8/1980 | Engdahl | 310/344 |
| 4,292,562 | 9/1981 | Feder | 310/351 |
| 4,443,728 | 4/1984 | Kudo | 310/348 |

FOREIGN PATENT DOCUMENTS

| | | | |
|---|---|---|---|
| 0003486 | 1/1979 | Japan | 310/348 |
| 5370782 | 5/1980 | Japan. | |
| 55-68716 | 5/1980 | Japan. | |
| 0093313 | 7/1980 | Japan | 310/348 |
| 55-93313 | 8/1980 | Japan. | |
| 0184315 | 11/1982 | Japan | 310/348 |
| 55107318 | 11/1982 | Japan. | |
| 57-184315 | 11/1982 | Japan. | |
| 2037070 | 7/1980 | United Kingdom. | |

*Primary Examiner*—Mark O. Budd
*Attorney, Agent, or Firm*—Douglas A. Boehm; Donald B. Southard; Charles L. Warren

[57] ABSTRACT

An improved method and apparatus is disclosed for perpendicularly mounting an AT-strip resonator on its longitudinal edge. The crystal blank is secured to the base at two or more mounting points via conductive cement which provides both electrical connection and mechanical support. A mounting cavity or slot permits proper positioning and self-fixturing during manufacture. The edge-mounting configuration promotes ease of manufacture, improved shock performance, minimized motional resistance degradation, and high packing density.

33 Claims, 5 Drawing Figures

EDGE-MOUNTING CONFIGURATION FOR AT-STRIP RESONATORS

BACKGROUND OF THE INVENTION

1. Field of the Invention

The present invention generally relates to piezoelectric crystal devices, and more particularly to edge-mounting configurations for AT-strip resonators used in numerous types of electronic equipment.

2. Description of the Prior Art

Piezoelectric resonators, such as AT-cut quartz crystals, are particularly well adapted for use in a wide variety of crystal filter and oscillator applications for communications equipment. With advancements in electronics miniaturization, a corresponding need arises for a tiny, reliable, inexpensive crystal resonator that retains its stringent electrical performance characteristics. Conventional approaches include the tuning fork-type crystal resonator and the disk-type crystal resonator. The tuning fork-type resonator, typically of XY'-cut quartz operating in the flexure vibration mode, is limited to low frequency applications of less than one MHz., i.e., crystal oscillators for wristwatches. The disk-type crystal resonator, typically made from AT-cut quartz operating in thickness-shear mode, accommodates these high frequency applications—but it is of such large dimensions that its use is severely restricted in many microelectronic applications. When the conventional disk-type crystal device is reduced in size, it exhibits substantial degradation in performance; particularly, temperature characteristics, motional capacitance, and resonator Q.

Recently, the AT-strip resonator was introduced as an improvement to the disk-type resonator to fulfill the aforementioned size, cost, and reliability objectives. The AT-strip resonator, comprised of a thin, rectangularly-shaped crystal blank, is of extremely small size (on the order of 240 mils×70 mils×4 mils), has an inherently low product cost (due to its minimal quartz usage and simple construction), and achieves improved mechanical integrity through shock and vibration (due to the small mass of the crystal blank).

The prior art literature describes two basic methods for mounting rectangular strip resonators: the cantilever mount and the parallel-plane mount. In the cantilever mounting configuration, the crystal blank is supported at a single end in an upright orientation such that the rectangular blank rests on its short edge. Mechanical support is typically provided by non-conductive cement applied to the short edge of the blank, and electrical connections are provided by a second application of conductive cement along the same edge to contact the electrodes. Although this AT-strip mounting configuration generally exhibits an acceptable level of electrical performance, it provides less than optimal mechanical shock and vibration performance in many applications specifying a particular type of crystal package. Furthermore, the cantilever mounting configuration also requires the use of a mounting fixture to fix the crystal in the upright position during the curing time of the cement.

In parallel-plane mounting, both short ends of the rectangular crystal blank are supported—either by affixing mechanical clips to the short edges of the rectangular crystal blank, or by cementing both short edges to the base—such that the surface plane of the crystal blank is parallel to the major surface plane of the base. Although the parallel-plane mounting method yields devices which demonstrate acceptable shock performance, the electrical performance of the resonator typically degrades from that of the cantilever-mount configuration. In the cement-mounted example, one reason for this degradation is that a portion of the uncured cement can migrate along the crystal surface and contaminates the active region of the resonator, thus degrading the crystal's motional resistance parameter. If the plane of the resonator is elevated above that of the base to inhibit this migration, then taller mounting bases and covers are required. Furthermore, the use of conductive cement for electrical connections to a parallel-plane-mounted resonator necessitates a second cement cure cycle for the cement applied to the top surface electrode.

A need, therefore, exists for an improved mounting configuration for rectangular AT-strip resonators which addresses both electrical resistance parameters and mechanical shock performance, as well as manufacturability.

SUMMARY OF THE INVENTION

Accordingly, it is a general object of the present invention to provide an improved mounting configuration for AT-strip resonators which eliminates the aforementioned deficiencies of the prior art.

A primary object of the present invention is to provide an improved mounting configuration for a rectangular quartz crystal resonator which maintains strict electrical parameters while improving mechanical shock and vibration performance.

A particular object of the present invention is to provide an improved method for mounting AT-strip resonators which eliminate the requirement of the mounting fixture to support the cyrstal during the cement curing cycle.

Briefly stated, the present invention provides an improved AT-strip resonator assembly comprising: a quartz crystal blank of substantially rectangular shape having two opposing major surfaces, two opposing longitudinal edges, and conductive material disposed on each of said opposing major surfaces to form electrodes; a base for supporting the crystal blank; and a means for mounting the crystal blank to the base by at least two separated mounting points adjacent to only a first of the two longitudinal edges such that the crystal blank opposing major surfaces are oriented substantially perpendicular to the base upper surface, where the mounting means includes a cavity located within the base upper surface for positioning said crystal blank on said base. If desired, the cavity can also provide self-fixturing of the crystal blank in the upright position during the cement curing cycle of the manufacturing operation.

In the preferred embodiment, the piezoelectric resonator is a rectangularly-shaped thickness-shear AT-cut quartz resonator, and the base cavity is constructed in the form of a slot connecting two feedthrough holes. Hence, the mounting method according to the present invention includes applying conductive cement into the feedthrough holes, and mounting the lower longitudinal edge of the crystal blank within the slot, such that the slot provides proper positioning of the crystal blank, and such that the slot cooperates with the cement to provide self-fixturing. Therefore, no additional fixturing is required to retain the quartz blank in a perpendicular position during the cement cure cycle.

The resultant AT-strip resonator assembly exhibits excellent electrical resistance parameters, since the crystal blank is secured only at the opposite ends of its longitudinal edge—not along the medial section of the blank. Furthermore, this longitudinal-edge mounting configuration provides greatly improved shock and vibration performance over prior art cantilever mounting configurations. Still further, the resonator assembly of the present invention generates the additional advantages of: defining the crystal blank placement on the substrate for device consistency; affording very efficient use of available quartz since the present mounting configuration allows a majority of the quartz surface area to be electroded; requiring minimal base substrate material since the quartz blank is mounted on its longitudinal edge; avoiding the additional material cost of lead frames; and obviating the additional manufacturing step of attaching lead frames to the blank.

BRIEF DESCRIPTION OF THE DRAWINGS

Additional objects, features, and advantages in accordance with the present invention will be more clearly understood by way of unrestricted example from the following detailed description taken together with the accompanying drawings in the several figures of which like referenced numerals identify like elements, and in which.

DETAILED DESCRIPTION OF THE INVENTION

Figure 1:
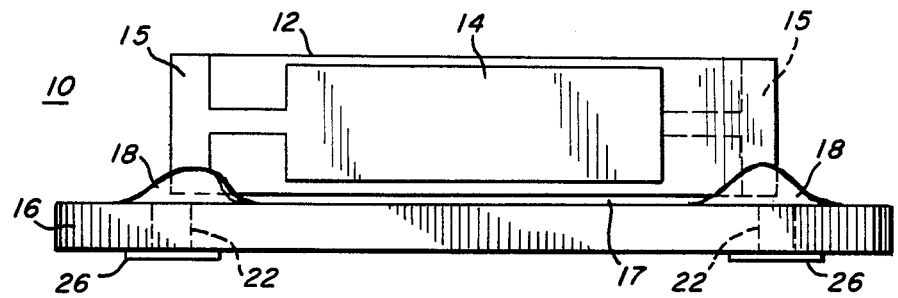
FIG. 1 is a planar view of an AT-strip resonator assembly illustrating one embodiment of the longitudinaledge mounting configuration.

Referring now to FIG. 1, piezoelectric resonator assembly 10 is shown mounted in the longitudinal-edge mounting configuration. AT-strip quartz blank 12 is a thin rectangularly-shaped crystal blank of AT-cut quartz operating in the thickness-shear mode of vibration. Quartz blank 12 would have typical dimensions of: overall length L approximately 240 mils; overall width W of approximately 70 mils; and thickness T of approximately 4 mils.

The crystal blank has metalization deposited on selected portions of both major surfaces to form electrode 14. The electrode covers a majority of the central surface area of the resonator, while the electrode coverage is reduced to form electrode tabs 15 at the opposite ends of the bar as shown.

Electrical connections are made by contacting electrode tabs 15 in any appropriate manner, such as through the use of wire bonds or conductive cement. If the latter is used, apertures 22 may be constructed to provide a passageway for the conductive cement to electrically couple electrode tabs 15 to connection pads 26 located on the underside surface of base 16. Thus, these apertures serve as feedthrough holes.

In the preferred embodiment, electrode tabs 15 are designed in the shape of a "T" to provide symmetry about the major longitudinal axis of the quartz blank so as to allow either of the two opposing longitudinal edges to be mounted to the base. Similarly, since conductive cement 18 contacts both major surfaces of the quartz blank at the two corners, the electrode pattern shown also provides end-to-end mounting symmetry such that no front surface/back surface mounting distinction exists. This symmetry may greatly enhance manufacturing operations.

According to the present invention, the AT-strip resonator blank is mounted along only one of its two longitudinal edges by cementing the two adjacent corners of the crystal blank to the base with conductive cement 18, such that the crystal blank stands on its longitudinal edge perpendicular to the base. Mounting base 16, comprised of a ceramic or glass substrate material, typically has a substantially planar upper surface, and may also exhibit a substantially uniform thickness. It is to be noted that the medial portion of the lower longitudinal edge of quartz bar 12 is separated from the upper surface of mounting base 16 by gap 17. This elevation of the crystal above the base surface acoustically decouples the active region of the resonator from the base. Furthermore, gap 17 inhibits cement 18 from migrating along the edge and contaminating the active region of the resonator prior to thermal cure, thus preventing this form of motional resistance degradation.

Hence, the longitudinal-edge mounting configuration of FIG. 1 provides improved shock and vibration performance over the short-edge cantilever mounting configuration, since the crystal blank is supported at both ends. Furthermore, the longitudinal-edge mounting configuration enables rectangular resonators to be securely mounted on the base substrate without experiencing the electrical performance degradation encountered with parallel-plane mounting orientations. Moreover, edge-mounting also allows a higher packing density to be achieved on a glass package substrate as compared to parallel-plane mounting. This higher packing density results in a significant reduction in product cost, since less substrate material is used. Still further, the longitudinal edge-mounting configuration is more conductive to manufacturing, since the conductive cement is applied to the base in a single manufacturing operation. As previously noted with parallel-plane mounting techniques, a second process step is required to apply additional conductive cement to the top-side electrode for electrical connections. (If a surplus amount of conductive cement—sufficient to contact the upper surface electrode—is applied in a single operation, then the excess cement will again inhibit motional resistance parameters.) The conductive cement in the instant feedthrough hole/connection pad arrangement also provides the dual-purpose function of electrical connection to the resonator. In sum, the longitudinal-edge mounted AT-strip resonator configuration of FIG. 1 provides numerous advantages over prior art crystal mounting methods.

Figure 2:
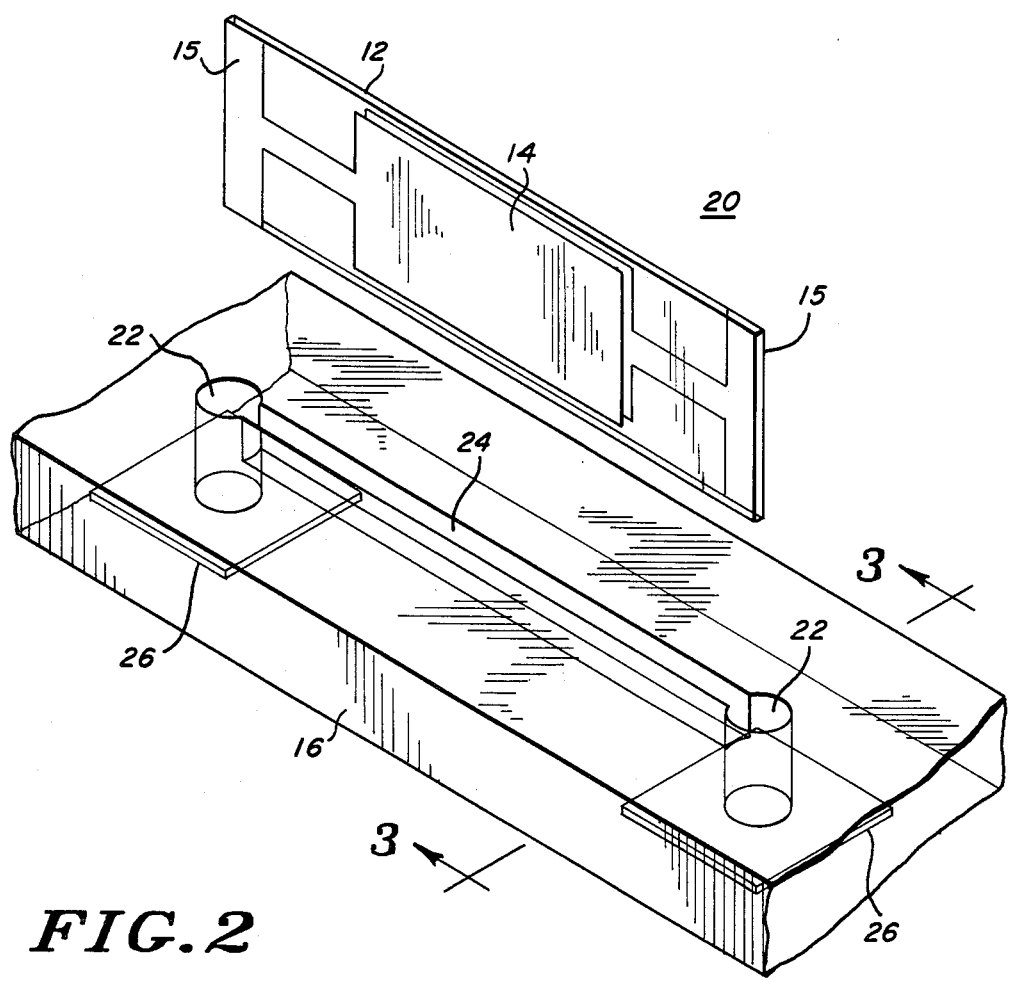
FIG. 2 is a perspective view of the preferred embodiment of the present invention showing the location of the crystal blank mounting slot.

FIG. 2 illustrates resonator assembly 20 which incorporates the preferred embodiment of the longitudinal-edge mounting configuration according to the present invention. In this embodiment, mounting slot 24, located between apertures 22, serves three independent purposes. First, the slot defines the exact placement of the crystal blank on the substrate for device-to-device consistency, and for proper fit of the cover. Second, the slot eliminates the need for fixturing quartz blank 12 in the upright position during the cement cure cycle of the manufacturing operation. Instead, the slot itself cooperates with the cement to provide self-fixturing of the crystal blank during the cement cure cycle, thus eliminating the fixturing step of the manufacturing process. Third, as a result of the crystal resonator being mounted within a recess in the base, the overall resonator package height can be reduced.

To accomplish these goals, mounting slot 24 must have appropriate dimensions which assist cement 18 in retaining quartz blank 12 in a relatively perpendicular orientation with respect to the base while the cement is curing. More specifically, the slot width must be greater than the thickness of the crystal blank to allow the longitudinal edge of the blank to be set entirely within the slot. On the other hand, the slot width must be narrow enough, and the slot depth deep enough, to retain the crystal blank in a relatively upright position with the assistance of the uncured cement. If, however, the self-fixturing aspect of the slot is not deemed necessary, or if dimensional limitations of the base prohibit the slot from achieving self-fixturing, then the slot may still be utilized as an aid to proper crystal placement.

As noted in FIG. 1, apertures 22 function as feedthrough holes, providing a passageway for the conductive cement to electrically couple electrode tabs 15 to connection pads 26. The feedthrough hole apertures of FIG. 2 also serve as measuring cavities for containing the proper amount of conductive cement 18. When conductive cement 18 is still fluid, a small amount flows into both ends of slot 24. This excess cement prevents the medial portion of the lower longitudinal edge of quartz blank 12 from contacting the bottom of slot 24. (The exact placement of the crystal blank in the aperture is shown in the next figure.) Thus, the active portion of the resonator is acoustically decoupled from the base.

Figure 3:
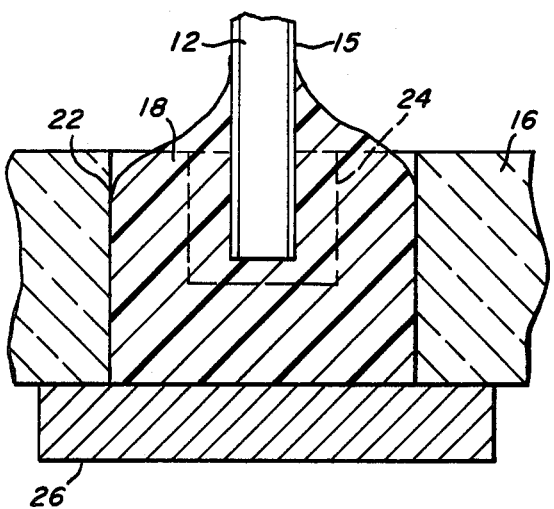
FIG. 3 is a cross-sectional view taken generally across the line 3—3 of FIG. 2 illustrating the positioning of the resonator in the slot.

FIG. 3 is a partial cross-sectional view of resonator assembly 20 taken across lines 3—3 of FIG. 2. FIG. 3 more clearly illustrates the final position of quartz blank 12 within slot 24 of base 16. As previously mentioned, cement 18 prevents the lower longitudinal edge of crystal blank 12 from contacting the bottom of slot 24. Therefore, since cement 18, primarily located within apertures 22, only contacts the end portions of the crystal longitudinal edge, the equivalent of gap 17 (FIG. 1) is created between the lower crystal edge and the base for purposes of acoustic decoupling. Moreover, this cross-sectional perspective illustrates that conductive cement 18 produces an electrical connection from aluminum pad 26 to electrode tab 15 on the crystal. (The individual manufacturing steps for mounting the crystal to the base will be described later).

Figure 4:
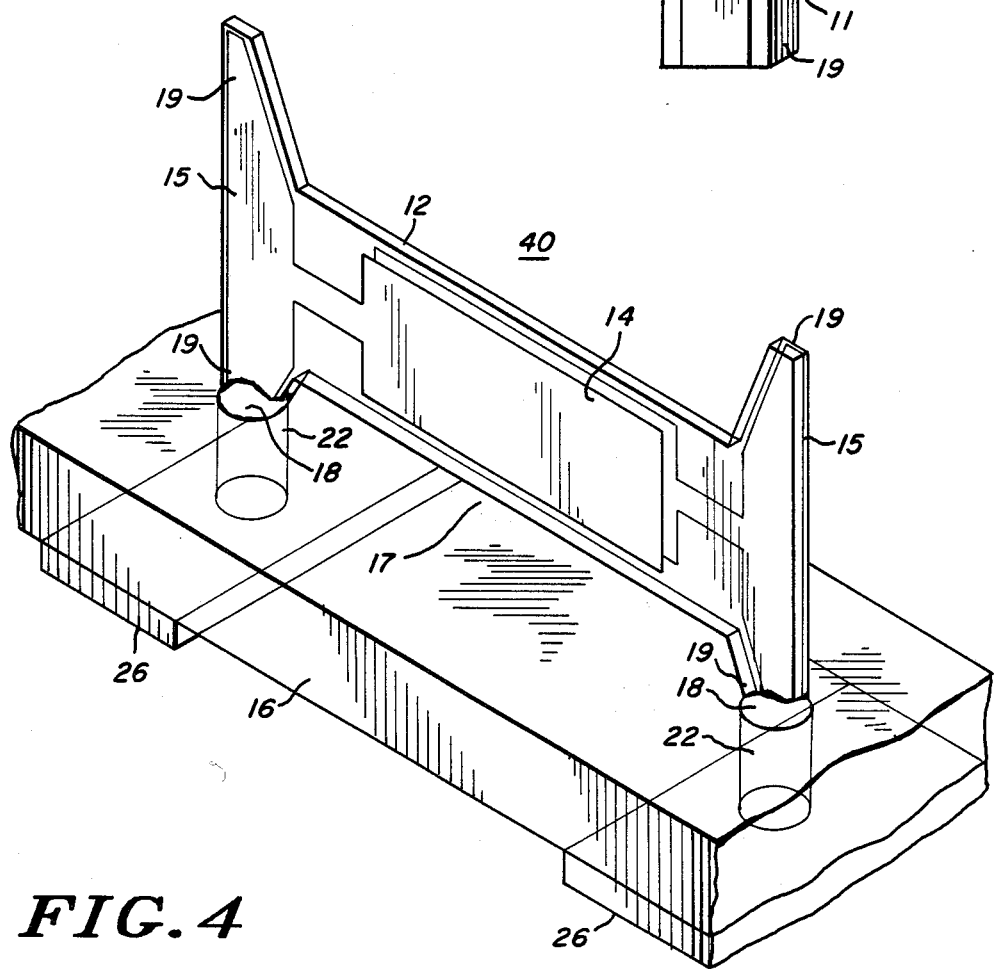
FIG. 4 is a perspective view of still another embodiment of the present invention illustrating the use of longitudinal-edge mounting feet.

Continuing now with FIG. 4, piezoelectric resonator assembly 40 illustrates another embodiment of the present invention. Instead of utilizing slot 24 as the mounting cavity for fixturing crystal blank 12 during the mounting operation, apertures 22 are used to support the blank via mounting feet 19. These mounting feet, located adjacent to and extending outwardly from the longitudinal edges of crystal blank 12, are constructed in accordance with the standard photolithographic-/etching techniques known in the art. Four mounting feet are illustrated in FIG. 4, which provide complete symmetry to accommodate any crystal blank orientation during the mounting operation. However, it will be apparent that only two mounting feet, located along the lower longitudinal edge of the crystal blank, are required. These two mounting feet are partially engaged into apertures 22 during the mounting operation. The mounting feet/aperture configuration illustrated in FIG. 4 provides the same self-fixturing benefit as the edge/slot configuration of FIGS. 2, i.e., no external crystal blank fixturing device is required during the cement curing cycle. Conductive cement 18 again functions as both an electrical connection—from connection pad 26 to electrode tab 15 through feedthrough aperture 22—as well as a mechanical support for crystal blank 12.

The shape of mounting foot 19 should promote ease of positioning the longitudinal edge of crystal blank 12 correctly within apertures 22, while at the same time provide for elevation of the medial portion of the longitudinal edge from the base. For example, in FIG. 4, at least one side of mounting foot 19 is tapered such that the width of the mounting foot, measured at the crystal blank's longitudinal edge, is larger than the upper base surface opening of aperture 22. Consequently, the larger section of mounting foot 19 cannot completely engage within aperture 22, thereby creating gap 17 between the lower longitudinal edge of crystal blank 12 and the upper surface of mounting base 16.

Figure 5:
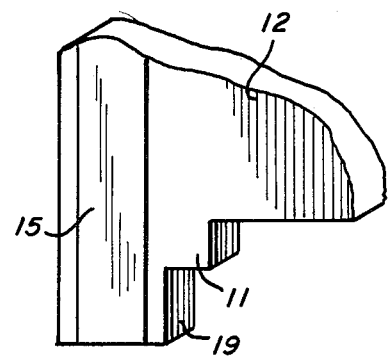
FIG. 5 is a partial view of an alternate mounting foot configuration adapted for use with the base of FIG. 4.

FIG. 5 illustrates an alternative shape for mounting foot 19. In this embodiment, mounting foot 19 exhibits no taper. However, flange 11, constructed as shown, functions as a shoulder preventing mounting foot 19 from completely engaging into aperture 22. Of course, the surface opening in aperture 22 must be less than the width of foot 19 at flange 11. Hence, a provision for gap 17 is again achieved. It will be apparent to those skilled in the art that other mounting foot configurations may also be utilized.

The following describes a specific example of an AT-strip resonator mounted in accordance with the preferred embodiment of FIG. 2. The AT-cut quartz blank has a length L of 240 mils, a width W of 70 mils, and a thickness T of 4 mils. Electrode 14, comprised of 200 angstroms chromium/1950 angstroms gold, is vapor-deposited onto (or photolithographically etched from) the quartz blank to form the desired pattern. Mounting base 16 is constructed to a rectangular shape having an approximate length of 300 mils, an approximate width of 50 mils, and an approximate thickness of 40 mils. In the preferred embodiment, base 16 is comprised of soda-lime-silicate glass. Aluminum connection pads 26 are approximately 50 mils square. Apertures 22 are round feedthrough holes exhibiting a 20 mil diameter and extending completely through the base, while mounting slot 24 is approximately 10 mils in width and 10 mils in depth. The center of apertures 22 are spaced 240 mils apart, which is the same as the overall length of quartz blank 12. Conductive cement 18, a silver-filled glass or polymer, performs both functions of electrical connection and mechanical support.

The following paragraphs provide a more detailed explanation of the method of manufacturing piezoelectric resonator assembly 20. First, two feedthrough hole apertures 22 are formed through the base. This may be accomplished by various manufacturing techniques, such as ultrasonic machining, chemical etching, sand abrading, hot stamping, etc. Then mounting slot 24 is constructed between the two feedthrough holes. Again, any of the aforementioned manufacturing techniques may be implemented.

Next, metalization is applied to glass base 16 to provide for connection pads 26. A thin-film deposition technique may be utilized to deposit a uniform layer of metal over the entire upper surface and lower surface of base 16. Then, utilizing conventional photolithographic techniques, the metalized surface can be etched to produce the desired electrical connection pattern. An alternate method is to bond a thin sheet of metal foil, of approximately 5 mils thick, to both surfaces of the base. The desired connection pad pattern can then be achieved via similar photolithographic etching techniques. The use of aluminum as the metal foil has proven successful, but other metals could also be used. Of course, instead of etching away unwanted portions of the metal foil, a foil pattern, previously stamped to have the desired pad configuration, could be formed and directly transferred onto either surface of base 16. In any case, metalized connection pads 26 on the underside of base 16 extend over the feedthrough holes to provide hermetic seals and to provide a means for electrically connecting to the resonator. In the preferred embodiment, the upper surface of the glass base exhibits metalized bonding rings for the electrostatic sealing of a glass cover plate.

Apertures 22 are then filled with a small volume of conductive cement. Since the cement is substantially fluid when applied, a small amount of cement will naturally flow into the end portions of slot 24.

While the cement is still viscous, the lower longitudinal edge of the AT-strip resonator is positioned within the slot such that cement 18 contacts crystal blank 12 at the two long-edge corners, and such that the crystal blank opposing major surfaces are oriented substantially perpendicular to the upper surface of the base. The conductive cement envelopes both surfaces of quartz blank 12 at the lower corners to provide both a mechanical mount and an electrical coupling from electrode tabs 15 to connection pads 26. The cement then is cured in accordance with the manufacturer's recommendations (i.e., heat curing, etc.).

Finally, an appropriate cover is attached to the base such that the resonator is hermetically sealed. In the preferred embodiment, the cover is also comprised of soda-lime-silicate glass, having an appropriate cavity for the resonator, wherein the glass cover is electrostatically bonded to the glass base. Hence, the resultant resonator package exhibits a height of only 130 mils, and a width of only 50 mils. The completed resonator package may then be mounted to a glass or ceramic substrate, or printed circuit board, such that connection pads 26 provide the electrical coupling from the resonator assembly to external circuitry.

In summary, an improved method and apparatus is provided for perpendicularly mounting an AT-strip resonator along its longitudinal edge. This mounting configuration promotes ease of manufacturability, improved shock performance, minimized electrical parameter degradation, and higher packing density than previous mounting configurations. Furthermore, it has been shown that the addition of a mounting slot in the base, wherein the longitudinal edge of the quartz bar is inserted, provides the additional advantages of lower package height, crystal blank placement definition, and self-fixturing during the manufacturing operation.

While specific embodiments of the present invention have been shown and described herein, further modifications and improvements may be made by those skilled in the art. All such modifications which retain the basic underlying principles disclosed and claimed herein are within the scope of this invention.

What is claimed is:

1. A piezoelectric resonator assembly comprising:
    a quartz crystal blank of substantially rectangular shape having two opposing major surfaces, two opposing longitudinal edges, and conductive material disposed on each of said two opposing major surfaces to form electrodes;
    base means for supporting said crystal blank, said base means having upper and lower surfaces; and
    means for mounting said crystal blank to said base means by at least two separated mounting points adjacent to only a first of said two longitudinal edges such that said crystal blank opposing major surfaces are oriented substantially perpendicular to said base means upper surface, said mounting means including cavity means located within said base means upper surface for positioning said crystal blank on said base means.

2. The piezoelectric resonator assembly according to claim 1, wherein said crystal blank is comprised of thickness-shear AT-cut quartz.

3. The piezoelectric resonator assembly according to claim 1, wherein said crystal blank exhibits the shape of a rectangular strip having a length being at least twice as great as its width.

4. The piezoelectric resonator assembly according to claim 1, wherein said base means is comprised of a glass substrate having a substantially planar upper surface.

5. The piezoelectric resonator assembly according to claim 1, wherein said base means includes connection means for providing electrical contacts from said base means to exterior circuitry.

6. The piezoelectric resonator assembly according to claim 5, wherein said connection means includes at least two aluminum foil pads affixed to said base means and extending adjacent to said cavity means.

7. The piezoelectric resonator assembly according to claim 1, wherein said mounting means includes conductive cement which provides electrical contact between said resonator electrodes and said base connection means.

8. The piezoelectric resonator assembly according to claim 7, wherein said cavity means cooperates with said conductive cement to provide a self-fixturing function such that said crystal blank is retained in said perpendicular orientation during the period of time that said conductive cement is curing.

9. The piezoelectric resonator assembly according to claim 1, wherein said separated mounting points of said mounting means are arranged at a location approximating that of the opposite ends of said crystal blank first longitudinal edge, and constructed such that the medial portion of said first longitudinal edge does not contact said base means.

10. The piezoelectric resonator assembly according to claim 1, wherein said cavity means includes slot means for providing a recess within said base means upper surface, said slot means having depth D, width W, and length L.

11. The piezoelectric resonator assembly according to claim 10, wherein said slot means width W is greater than one times but less than three times the thickness of said crystal blank, wherein said slot depth D is greater than the thickness of said crystal blank, and wherein said slot length L is at least equal to the length of said crystal blank first longitudinal edge.

12. The piezoelectric resonator assembly according to claim 1, wherein said cavity means includes means for providing at least one aperture extending from said base means upper surface through to said base means lower surface.

13. The piezoelectric resonator assembly according to claim 12, wherein said aperture means includes two feedthrough holes located in said base means at a location approximating that of the opposite ends of said crystal blank first longitudinal edge.

14. The piezoelectric resonator assembly according to claim 13, wherein said mounting means includes conductive cement located substantially within said feedthrough holes, and applied such that said cement contacts said resonator electrodes to provide electrical connections from said crystal blank to said base means.

15. The piezoelectric resonator assembly according to claim 1, wherein said mounting means includes at least two quartz tab members protruding from and adjacent to said crystal blank first longitudinal edge.

16. The piezoelectric resonator assembly according to claim 15, wherein at least two of said crystal blank tab members extend at least partially within said cavity means and cooperate with said conductive cement to provide a self-fixturing function such that said crystal blank is retained in said perpendicular orientation during the period of time that said conductive cement is curing.

17. The piezoelectric resonator assembly according to claim 1, wherein said piezoelectric resonator assembly is made by:
   (a) constructing a slot into said base means upper surface;
   (b) applying conductive cement to at least a portion of said slot; and
   (c) positioning only a first of said two longitudinal edges of said crystal blank on said base means such that said crystal blank opposing major surfaces are oriented substantially perpendicular to said base means upper surface, and such that said first longitudinal edge lies within and is cemented to said slot by at least two separated mounting points adjacent to said first longitudinal edge.

18. A piezoelectric resonator assembly comprising:
a thickness-shear AT-cut quartz crystal blank of substantially rectangular shape having two opposing major surfaces, two opposing longitudinal edges, and conductive material disposed on each of said two opposing major surfaces to form electrodes; and
base means having a substantially planar upper surface for supporting said crystal blank, said base means upper surface including slot means constructed therein for providing proper positioning of said crystal blank;
said crystal blank being mounted to said base means by applying conductive cement to at least a portion of said slot means, and by positioning only a first of said two longitudinal edges of said crystal blank on said base means such that said crystal blank opposing major surfaces are oriented substantially perpendicular to said base means upper surface, and such that said first longitudinal edge lies within and is cemented to said slot means by at least two separated mounting points adjacent to said first longitudinal edge.

19. The piezoelectric resonator assembly according to claim 18, wherein said base means includes connection means for providing electrical contacts from said base means to exterior circuitry.

20. The piezoelectric resonator assembly according to claim 19, wherein said connection means includes at least two aluminum foil pads affixed to said base means and extending adjacent to said slot means.

21. The piezoelectric resonator assembly according to claim 19, wherein said conductive cement provides electrical contact between said resonator electrodes and said base connection means.

22. The piezoelectric resonator assembly according to claim 18, wherein said slot means cooperates with said conductive cement to provide a self-fixturing function such that said crystal blank is retained in said perpendicular orientation during the period of time that said conductive cement is curing.

23. The piezoelectric resonator assembly according to claim 18, wherein said separated mounting points are arranged at a location approximating that of the opposite ends of said crystal blank first longitudinal edge, and constructed such that the medial portion of said first longitudinal edge does not contact said base means.

24. The piezoelectric resonator assembly according to claim 18, wherein said slot means width W is greater than one times but less than three times the thickness of said crystal blank, wherein said slot depth D is greater than the thickness of said crystal blank, and wherein said slot length L is at least equal to the length of said crystal blank first longitudinal edge.

25. The piezoelectric resonator assembly according to claim 18, wherein said slot means includes two feedthrough holes located in said base means at a location approximating that of the opposite ends of said crystal blank first longitudinal edge, said feedthrough holes extending from said base means upper surface through to said base means lower surface.

26. The piezoelectric resonator assembly according to claim 25, wherein said conductive cement is located substantially within said feedthrough holes, and applied such that said cement contacts said resonator electrodes to provide electrical connections from said crystal blank to said base means.

27. A method for mounting a quartz crystal blank of substantially rectangular shape to a base having a substantially planar upper surface, said crystal blank having two opposing major surfaces, two opposing longitudinal edges, and conductive material disposed on each of said two opposing major surfaces to form electrodes, said mounting method comprising the steps of:
   (a) constructing a slot into said base upper surface, said slot having a depth D, width W, and length L;
   (b) applying conductive cement to at least a portion of said slot; and
   (c) positioning only a first of said two longitudinal edges of said crystal blank on said base such that said crystal blank opposing major surfaces are oriented substantially perpendicular to said base upper surface, and such that said first longitudinal edge lies within and is cemented to said slot by at least two separated mounting points adjacent to said first longitudinal edge.

28. The method according to claim 27, wherein said crystal blank is comprised of thickness-shear AT-cut quartz.

29. The method according to claim 27, wherein said slot width W is greater than one times but less than three times the thickness of said crystal blank, wherein said slot depth D is greater than the thickness of said crystal blank, and wherein said slot length L is at least equal to the length of said crystal blank first longitudinal edge.

30. The method according to claim 27, wherein said slot cooperates with said conductive cement to provide a self-fixturing function such that said crystal blank is retained in said perpendicular orientation during the period of time that said conductive cement is curing.

31. The method according to claim 27, wherein said separated mounting points are arranged at a location approximating that of the opposite ends of said crystal blank first longitudinal edge, and constructed such that the medial portion of said first longitudinal edge does not contact said base.

32. The method according to claim 27, further comprising the step of:
constructing two feedthrough holes extending through said base at a location approximately that of the opposite ends of said crystal blank first longitudinal edge.

33. The method according to claim 32, wherein said conductive cement is located substantially within said feedthrough holes, and applied such that said cement contacts said resonator electrodes to provide electrical connections from said crystal blank to said base.

* * * * *